(12) United States Patent
Jung et al.

(10) Patent No.: US 6,906,545 B1
(45) Date of Patent: Jun. 14, 2005

(54) VOLTAGE MEASUREMENT DEVICE TOLERANT OF UNDERSHOOTING OR OVERSHOOTING INPUT VOLTAGE OF PAD

(75) Inventors: Young-Hee Jung, Gyeonggi-do (KR); Sang-Seok Kang, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/359,527

(22) Filed: Feb. 5, 2003

(30) Foreign Application Priority Data

Apr. 30, 2002 (KR) .............................. 10-2002-0023654

(51) Int. Cl.[7] .............................................. G01R 31/26
(52) U.S. Cl. .................................... 324/765; 324/158.1
(58) Field of Search .......................... 324/158.1, 765, 324/763, 754, 769; 327/436, 427, 581, 583, 574, 108, 437, 403, 404, 405; 331/116 FE, 116; 330/277; 326/121; 714/719, 724

(56) References Cited

U.S. PATENT DOCUMENTS

| | | | | |
|---|---|---|---|---|
| 4,473,758 A | * | 9/1984 | Huntington | ................. 327/537 |
| 4,709,172 A | * | 11/1987 | Williams | .................... 327/437 |
| 5,347,169 A | * | 9/1994 | Preslar et al. | ............... 327/110 |
| 5,373,199 A | * | 12/1994 | Shichinohe et al. | ........ 327/328 |
| 5,767,733 A | * | 6/1998 | Grugett | ...................... 327/534 |
| 5,789,968 A | * | 8/1998 | John | .......................... 327/436 |
| 6,229,405 B1 | * | 5/2001 | Hashimoto | ............ 331/116 FE |

* cited by examiner

*Primary Examiner*—Vinh Nguyen
*Assistant Examiner*—Jimmy Nguyen
(74) *Attorney, Agent, or Firm*—Marger Johnson & McCollom, P.C.

(57) ABSTRACT

There is provided a voltage measurement device that is stable with respect to an undershot or overshot input voltage of a pad. The voltage measurement device includes a voltage line, a pad, a signal generating unit, a first switch, and a second switch. The first switch is connected between the pad and the second switch and the second switch is connected to the voltage line. The signal generating unit receives a control signal and generates an inverted control signal. The voltage line is connected to the pad through the first and second switches that are responsive to the control signal. The pad is also connected to an internal circuit block, so that the internal circuit block is driven according to a pad input. Specifically, the first and second switches can be implemented with an NMOS transistor and a PMOS transistor that are responsive to the control signal and the inverted control signal, respectively. Therefore, even if a logic level input to the pad is an undershot or overshot voltage level, a voltage level of the voltage line is not changed.

7 Claims, 2 Drawing Sheets

6,906,545 B1

VOLTAGE MEASUREMENT DEVICE TOLERANT OF UNDERSHOOTING OR OVERSHOOTING INPUT VOLTAGE OF PAD

This application relies for priority upon Korean Patent Application No. 2002-23654, filed on Apr. 30, 2002, the contents of which are herein incorporated by reference in their entirety.

BACKGROUND

1. Field

The present disclosure relates to a semiconductor integrated circuit, and more particularly, to a voltage measurement circuit for measuring an internal voltage of a chip.

2. Discussion of the Related Art

Generally, a power supply voltage for inside a chip employs an external power supply voltage input itself or a dropped or boosted voltage. Here, the dropped or boosted voltage can be obtained by dropping or boosting an external voltage to a predetermined voltage level through an internal voltage generating circuit. Since the internal voltage generated by the internal voltage generating circuit is used as an operating voltage within the chip, the internal voltage must be maintained at a stable voltage level.

FIG. 1 illustrates a conventional voltage measurement device for measuring an internal voltage. Referring to FIG. 1, the voltage measurement device includes a switching unit 120 connected to a pad 110, and an internal circuit block 140. The switching unit 120 connects an internal DC voltage line 130 to the pad 110 in response to a control signal CTRL. The pad 110 is an input pad for input of a signal for driving the internal circuit block 140, for example, an address signal or a command signal. In case of measuring an internal DC voltage, a voltage level of the internal DC voltage line 130 is applied to the pad 110.

However, the conventional voltage measurement device has following problems.

First, in case where the switching unit 120 is provided with a PMOS transistor 124, if the control signal (CTRL) is a high level (hereinafter, referred to as "H level"), the PMOS transistor 124 is turned off. At this point, a logic level input to the pad 110 is transferred to the internal circuit block 140. In the meantime, if a logic level input to the pad 110 is overshot up to "H level+Vtp", where Vtp is the overshot voltage, the turned-off PMOS transistor 124 is turned on. Therefore, the overshot voltage level of the pad 110 is transferred to the internal DC voltage line 130, so that the internal DC voltage fluctuates. This results in a change of the internal DC voltage that must be maintained at a stable voltage level.

Second, in case where the switching unit 120 is provided with an NMOS transistor 122, if the control signal CTRL is a low level (hereinafter, referred to as "L level"), the NMOS transistor 122 is turned off. At this point, if a logic level inputted into the pad 110 is undershot down to "L level-Vtn", where Vtn is the undershot voltage, the turned-off NMOS transistor 122 is turned on. Therefore, the undershot voltage level of the pad 110 is transferred to the internal DC voltage line 130, so that the internal DC voltage fluctuates.

Third, in case where the switching unit 120 is provided with an NMOS transistor 122 and a PMOS transistor 124, if the control signal CTRL is a low level, the NMOS transistor 122 and the PMOS transistor 124 are turned off. At this point, if a logic level input to the pad 110 is overshot up to "H level+Vtp" or undershot down to "L level-Vtn", the turned-off NMOS transistor 122 and the turned-off PMOS transistor 124 are turned on. Therefore, the overshot or undershot voltage level of the pad 110 is transferred to the internal DC voltage line 130, so that the internal DC voltage fluctuates.

Therefore, it is necessary to provide a circuit for measuring the internal voltage through the input pad without changing the internal DC voltage.

SUMMARY OF THE INVENTION

An object of the present invention is to provide a voltage measurement device capable of measuring an internal voltage through an input pad without changing an internal DC voltage.

To accomplish the above object, a voltage measurement device includes a voltage line, a pad, a signal generating unit, a first switch, and a second switch. The first switch is connected between the pad and the second switch, and the second switch is connected to the voltage line. The signal generating unit receives a control signal and generates an inverted control signal. The voltage line is connected to the pad through the first and second switches that are responsive to the control signal. The pad is also connected to an internal circuit block, so that the internal circuit block is driven according to a pad input. Specifically, the first switch is implemented with an NMOS transistor responsive to the control signal and the second switch is implemented with a PMOS transistor responsive to the inverted control signal.

Accordingly, in accordance with the voltage measurement device of the present invention, even when an overshot or undershot voltage level is inputted into the pad, a voltage level of the voltage line is not changed.

DETAILED DESCRIPTION OF THE EMBODIMENTS

Hereinafter, a voltage measurement device for measuring a voltage level of an inside of a chip will be described in detail.

Figure 1:
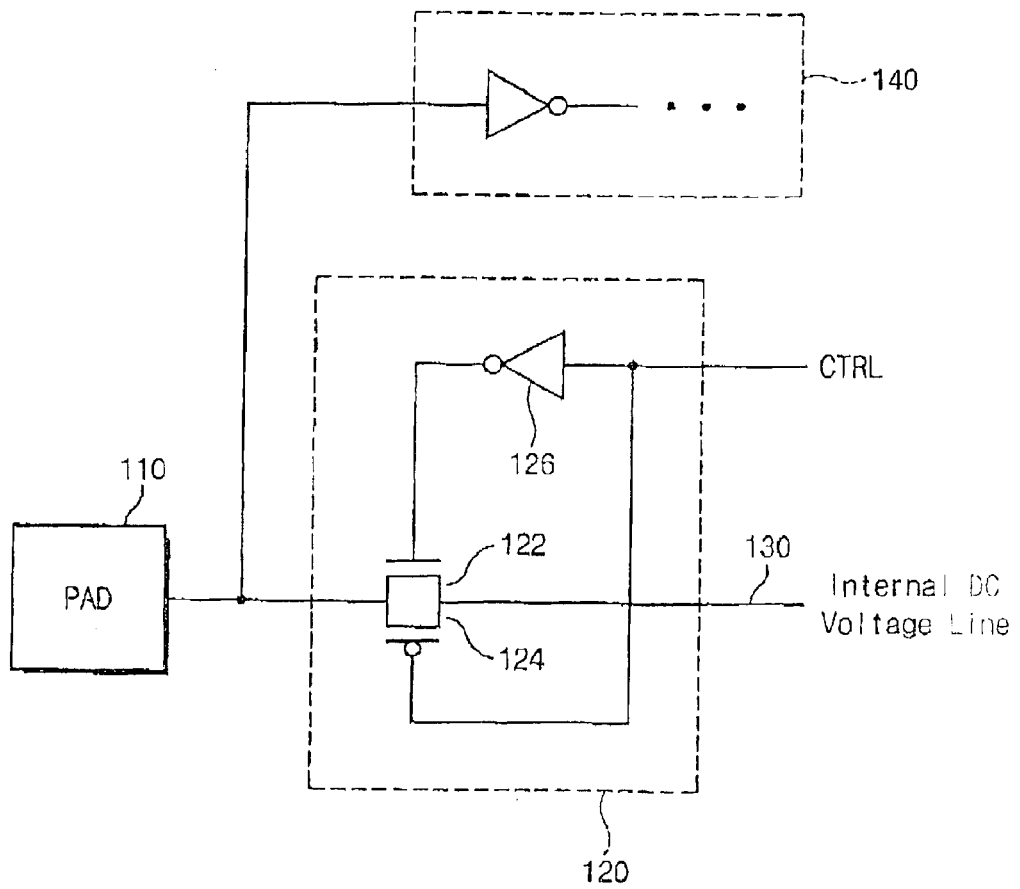
FIG. 1 is a view of a conventional voltage measurement device.
Figure 2:
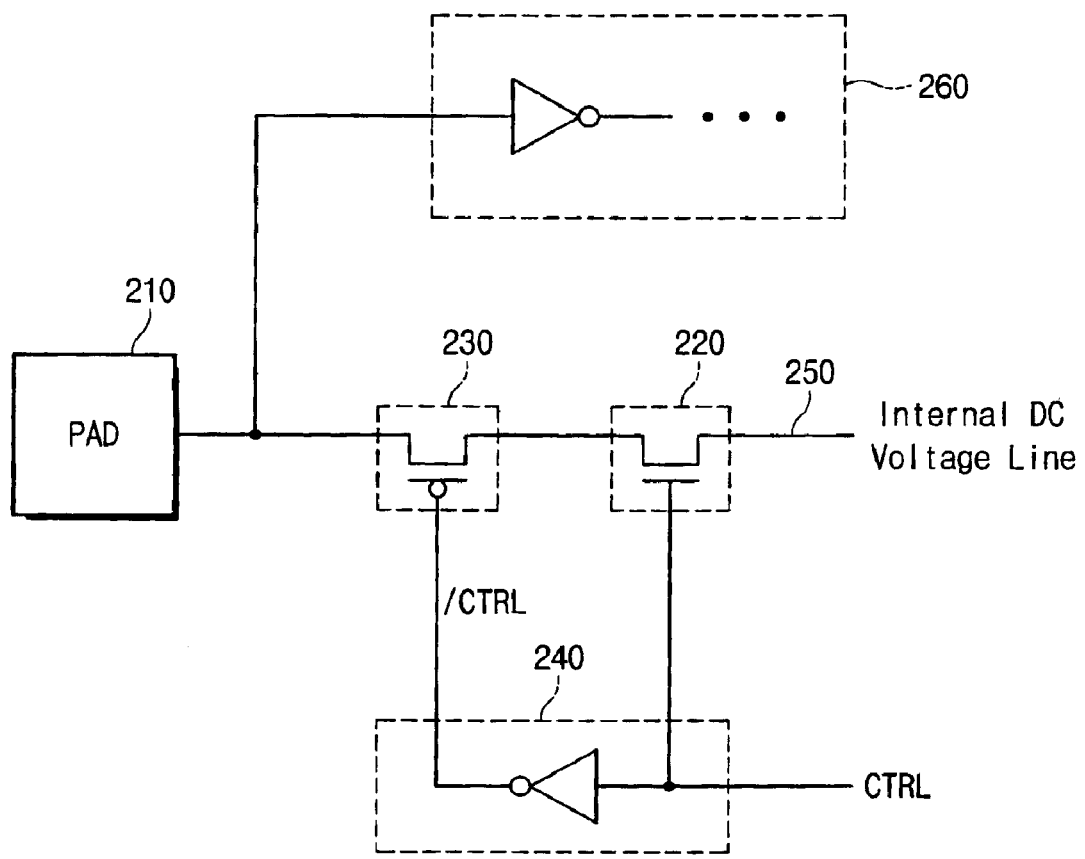
FIG. 2 is a view of a voltage measurement device in accordance with an embodiment of the present invention.

FIG. 2 is a view of a voltage measurement device in accordance with an embodiment of the present invention. Referring to FIG. 2, the voltage measurement device of the present invention includes a pad 210, a first switch 220, a second switch 230, a signal generating unit 240, an internal DC voltage line 250, and an internal circuit block 260. The pad 210 is connected to the internal circuit block 260 and drives the internal circuit block 260 according to a signal input to the pad 210. The signal generating unit 240 receives a control signal CTRL and generates an inverted control signal /CTRL. The first switch 220 includes an NMOS transistor which is responsive to the control signal CTRL, and the second switch 230 includes a PMOS transistor which is responsive to the inverted control signal /CTRL.

In the voltage measurement device, the first switch 220 is turned on in response to the control signal CTRL of a high level, and the second switch 230 is turned on in response to the inverted control signal /CRTL of a low level. At this point, the internal DC voltage line 250 is connected to the pad 210, so that the voltage level of the pad 210 is measured.

On the contrary, the first switch 220 is turned off in response to the control signal CTRL of a low level, and the second switch 230 is turned off in response to the inverted control signal /CTRL of a high level. At this point, the internal DC voltage line 250 is disconnected from the pad 210. The logic level input to the pad 210 is transferred to the internal circuit block 260, thereby driving the internal circuit block 260.

Here, if the logic level input to the pad 210 is an overshot voltage level of "H level+Vtp", the second switch 230 may be turned on. However, since the first switch 220 is still maintained in a turned-off state, the overshot voltage level of the pad 210 is not transferred to the internal DC voltage line 250.

In the meantime, if the logic level input to the pad 210 is an undershot voltage level of "L level-Vtn", the undershot voltage level of the pad 210 is not transferred to the internal DC voltage line 250 by the turned-off second switch 230.

In the meantime, unlike the case of FIG. 2, the first switch 220 and the second switch 230 contained in the voltage measurement device of the present invention can be also implemented with the PMOS transistor and the NMOS transistor, respectively. The first switch 220, i.e., the P-MOS transistor, is responsive to the inverted control signal, and the second switch 230, i.e., the N-MOS transistor, is responsive to the control signal. The first and second switches 220 and 230 are turned on in response to the inverted control signal /CTRL of a low level and the control signal of a high level, respectively. Then, the voltage level of the pad 210 is connected to the internal voltage line 250, so that the voltage level of the pad 210 is measured. Thereafter, the first and second switches 220 and 230 are turned off in response to the inverted control signal/CTRL of a high level and the control signal CTRL of a low level, respectively. Consequently, the pad 210 is disconnected from the internal DC voltage line 250.

At this point, if the logic level input to the pad 210 is the undershot voltage level of "L level-Vtn", the second switch 230, i.e., the NMOS transistor, can be turned on. However, since the first switch, i.e., the P-MOS transistor, is still maintained in a turned-off state, the undershot voltage level of the pad 210 is not transferred to the internal DC voltage line 250. In the meantime, if the logic level input to the pad 210 is the overshot voltage level of "H level+Vtp", the overshot voltage level of the pad 210 is not transferred to the internal DC voltage line 250 due to the turned-off second switch 230, i.e., the NMOS transistor.

Therefore, according to the voltage measurement of the present invention, even if the pad 210, which is connected to the internal DC line 250 and thus measures the voltage level, is used as an input pad for driving the internal circuit block 260, the voltage level of the internal DC voltage line 250 is stable compared with the prior art, since the overshot or undershot voltage level of the input pad is not transferred to the internal voltage line 250.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A voltage measurement device comprising:

a voltage line;

a pad;

a signal generating means to receive a control signal and to generate an inverted control signal;

a first switch connected to the pad and responsive to a control signal; and a second switch connected between the first switch and the voltage line and responsive to the inverted control signal, the first and second switches arranged such that one of the first and second switches block voltages beyond a predetermined range from the input.

2. The voltage measurement device of claim 1, wherein the first switch is an NMOS transistor and the second switch is a PMOS transistor.

3. The voltage measurement device of claim 1, wherein the first switch is a PMOS transistor and the second switch is an NMOS transistor.

4. A voltage measurement device for measuring an internal voltage of a chip, the voltage measurement device comprising:

an internal voltage line of a chip;

an input pad connected to circuit blocks, the circuit blocks being contained in an inside of the chip;

a signal generating means for receiving a control signal and generating an inverted control signal;

a first switch connected to the input pad and responsive to the control signal; and a second switch corrected between the first switch and the internal voltage line of a chip and responsive to the inverted control signal.

5. The voltage measurement device of claim 4, wherein the first switch is an NMOS transistor and the second switch is a PMOS transistor.

6. The voltage measurement device of claim 4, wherein the first switch is a PMOS transistor and the second switch is an N-MOS transistor.

7. A method of measuring an internal voltage of a chip, the method comprising:

providing an input pad connected to circuit blocks;

providing a control signal, the control signal operable to turn on first and second switches;

connecting an internal voltage line to the input pad through the first and second switches; and removing the control signal to turn off the first and second switches, wherein one of the first and second switches operates to block any voltage beyond a predetermined range from the input pad.

* * * * *

UNITED STATES PATENT AND TRADEMARK OFFICE
CERTIFICATE OF CORRECTION

PATENT NO. : 6,906,545 B1
APPLICATION NO. : 10/359527
DATED : June 14, 2005
INVENTOR(S) : Jung et al.

It is certified that error appears in the above-identified patent and that said Letters Patent is hereby corrected as shown below:

At column 2, line 54, replace "The-pad" with --The pad--
At column 4, line 18, replace "input." With --input pad--
At column 4, line 36, replace "corrected" with --connected--

Signed and Sealed this

Third Day of July, 2007

JON W. DUDAS
*Director of the United States Patent and Trademark Office*